United States Patent
Alptekin et al.

(10) Patent No.: US 9,472,415 B2
(45) Date of Patent: Oct. 18, 2016

(54) DIRECTIONAL CHEMICAL OXIDE ETCH TECHNIQUE

(71) Applicant: International Business Machines Corporation, Armonk, NY (US)

(72) Inventors: Emre Alptekin, Fishkill, NY (US); Sivananda K. Kanakasabapathy, Niskayuna, NY (US); Ahmet S. Ozcan, Chappaqua, NY (US); Viraj Y. Sardesai, Poughkeepsie, NY (US); Cung D. Tran, Newburgh, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 66 days.

(21) Appl. No.: 14/265,402

(22) Filed: Apr. 30, 2014

(65) Prior Publication Data

US 2015/0318184 A1    Nov. 5, 2015

(51) Int. Cl.
*H01L 21/76* (2006.01)
*H01L 21/311* (2006.01)

(52) U.S. Cl.
CPC ................. *H01L 21/31116* (2013.01)

(58) Field of Classification Search
CPC .............. H01L 21/31116; H01L 21/76897
USPC ........................................................ 438/424
See application file for complete search history.

(56) References Cited

U.S. PATENT DOCUMENTS

| | | | |
|---|---|---|---|
| 5,106,767 A | 4/1992 | Comfort et al. | |
| 5,282,925 A * | 2/1994 | Jeng et al. | 216/59 |
| 5,384,281 A | 1/1995 | Kenney et al. | |
| 5,505,816 A * | 4/1996 | Barnes et al. | 438/695 |
| 5,654,570 A * | 8/1997 | Agnello | H01L 21/28061 257/338 |
| 6,025,255 A | 2/2000 | Chen et al. | |
| 6,146,997 A | 11/2000 | Liu et al. | |
| 6,215,190 B1 | 4/2001 | Bruce et al. | |
| 6,486,015 B1 | 11/2002 | Chaudhary et al. | |
| 6,528,428 B1 * | 3/2003 | Chen | H01L 21/76808 257/E21.579 |
| 6,828,242 B2 * | 12/2004 | Okuyama | H01L 21/28061 257/E21.507 |
| 6,878,622 B1 * | 4/2005 | Yang et al. | 438/640 |
| 6,960,523 B2 | 11/2005 | Maldei et al. | |
| 7,344,983 B2 | 3/2008 | Deshpande et al. | |
| 7,985,676 B2 * | 7/2011 | Klee | H01L 21/0337 257/E21.585 |
| 8,232,204 B1 | 7/2012 | Horak et al. | |

(Continued)

OTHER PUBLICATIONS

Rupp et al., "High Yielding Self-Aligned Contact Process for a 0.150-um DRAM Technology", IEEE Transactions on Semiconductor Manufacturing, vol. 15, No. 2, May 2002, pp. 223-228.
Graf et al., "Highly Selective Oxide to Nitride Etch Processes on BPSG/Nitride/Oxide Structures in a MERIE Etcher", 1998 IEEE/SEMI Advanced Semiconductor Manufacturing Conference, pp. 314-319.

(Continued)

*Primary Examiner* — Matthew Landau
*Assistant Examiner* — Igwe U Anya
(74) *Attorney, Agent, or Firm* — Scully, Scott, Murphy & Presser, P.C.; Steven J. Meyers (57) ABSTRACT

A method of forming a trench in an oxide layer; where the oxide layer is formed on top of a nitride layer. The trench is formed using an iterative etching technique until the nitride layer is exposed, each iterative etching step includes; using an isotropic etching technique to remove a portion of the oxide layer, the isotropic etching technique produces a byproduct that remains along a sidewall and a bottom of the trench, then using an anisotropic etching technique to remove the salt from the bottom of the trench, leaving salt on the sidewalls of the trench.

11 Claims, 8 Drawing Sheets

(56) References Cited

U.S. PATENT DOCUMENTS

| | | | |
|---|---|---|---|
| 2002/0117399 A1* | 8/2002 | Chen | C23C 14/165 |
| | | | 205/125 |
| 2005/0082089 A1* | 4/2005 | Grunow | H01L 21/76805 |
| | | | 174/266 |
| 2007/0190266 A1* | 8/2007 | Fu | H01L 21/76814 |
| | | | 427/569 |
| 2008/0023748 A1 | 1/2008 | Ding | |
| 2008/0026564 A1* | 1/2008 | Frohberg | H01L 21/76804 |
| | | | 438/637 |
| 2011/0061810 A1 | 3/2011 | Ganguly et al. | |
| 2014/0094036 A1* | 4/2014 | Or et al. | 438/715 |
| 2014/0199851 A1* | 7/2014 | Nemani et al. | 438/724 |

OTHER PUBLICATIONS

Disclosed Anonymously, "Method for a Self Aligning Contact (SAC) with Replacement Metal Gate (RMG)", an IP.com Prior Art Database Technical Disclosure, IP.com No. IPCOM000203531D, IP.com Electronic Publication: Jan. 27, 2011, pp. 1-4.

Davis et al., "Borderless Diffusion Contact Process for Array Structures", An IP.com Prior Art Database Technical Disclosure, Original Publication Date: Oct. 1, 1987, Original Disclosure Information: Research Disclosure n282 10-87, IP.com No. IPCOM000041149D, IP.com Electronic Publication: Feb. 2, 2005.

* cited by examiner

DIRECTIONAL CHEMICAL OXIDE ETCH TECHNIQUE

BACKGROUND

The present invention generally relates to the fabrication of integrated circuits, and more particularly to a technique of fabricating a contact trench using a combination of an isotropic etching technique and an anisotropic etching technique.

In the field of semiconductor devices, active semiconductor devices such as, for example, a transistor may be formed on a front-end-of-line of a semiconductor wafer. A transistor may be, for example, a field-effect-transistor (FET) and more specifically may be a complementary metal-oxide-semiconductor (CMOS) FET.

Generally, after a transistor is formed, conductive contacts are formed to connect the middle-end-of-line or back-end-of-line to a source, drain, and/or gate of the transistor to make the transistor functional. With the continuous scaling down in device dimension in integrated circuitry, real estate for forming corresponding contacts is also scaling down. In order to accomplish high device packing density, smaller feature sizes are also required. The feature sizes may include, for example, the width and spacing of interconnecting lines, spacing and diameter of contact holes, and the surface geometry such as corners and edges of various device structures.

SUMMARY

According to one embodiment of the present invention, a method of forming a contact trench in an oxide layer is provided. The method may include forming a structure including a source-drain region in a substrate, a gate structure above the substrate and adjacent to the source-drain region, and a nitride layer on the substrate and on the source-drain region. The gate structure may include a gate, a gate cap, and a gate spacer, where the gate cap may be on top of the gate and the gate spacers may be on the sidewalls of the gate. The method may also include forming an oxide layer on top of the gate structure and on top of the nitride layer. A contact trench may be formed in the oxide layer using an iterative etching technique until the nitride layer is exposed. Each iterative etching step may include; using an isotropic etching technique to remove a portion of the oxide layer, the isotropic etching technique may produce a byproduct, which may conformally form along a sidewall and a bottom of the contact trench; next, using an anisotropic etching to remove the byproduct from the bottom of the contact trench; the byproduct may remain on the sidewall of the contact trench.

According to another embodiment of the present invention, a method of forming a contact trench in an oxide layer is provided. The method may include forming a contact trench in an oxide layer, the contact trench may be above a nitride layer, and the trench may be formed using an iterative etching technique until the nitride layer is exposed. Each iterative etching step may include; using an isotropic etching technique to remove a portion of the oxide layer, the isotropic etching technique may produce a byproduct, which may conformally form along a sidewall and a bottom of the contact trench; next, using an anisotropic etching to remove the byproduct from the bottom of the contact trench; the byproduct may remain on the sidewall of the contact trench.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention generally relates to the fabrication of integrated circuits, and more particularly to a technique of fabricating a contact trench using a combination of isotropic and anisotropic etching techniques. A contact trench may refer to a trench, a hole, or any other form of opening as is well known in the art. Ideally, it may be preferable to etch a contact trench having a tight pitch without over-etching and damaging an underlying semiconductor device. One way to etch a contact trench with a tight pitch and without over-etching may include iteratively alternating between isotropic and anisotropic etching techniques. An embodiment by which to etch the trench with a tight pitch and without over-etching is described in detail below by referring to the accompanying drawings FIGS. 1-10. In the present embodiment, the trench may be formed by alternating between a COR etching technique and a low bias anisotropic selective sputtering technique.

Figure 1:
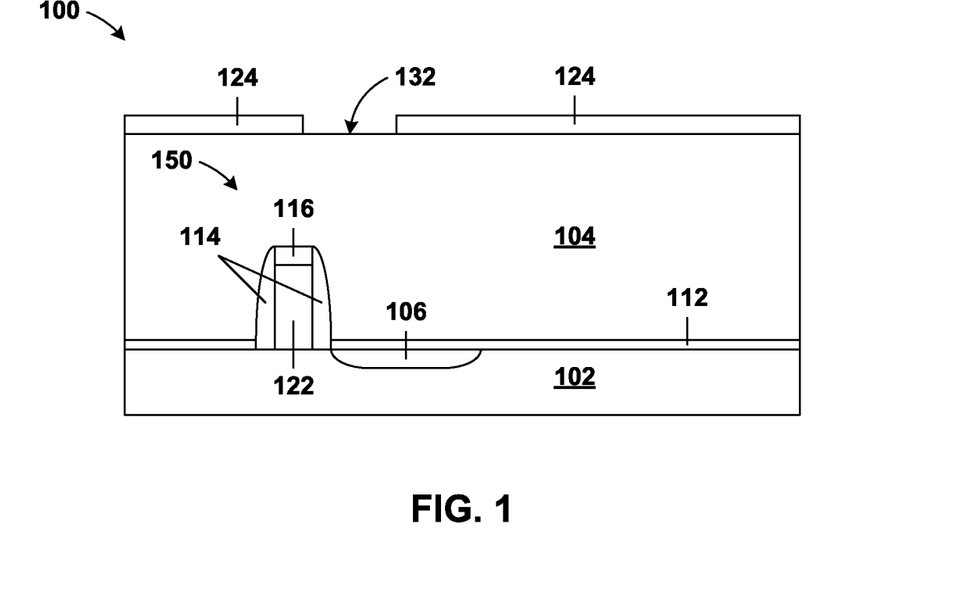
FIG. 1 is a cross-sectional view of a semiconductor structure according to an exemplary embodiment.

FIG. 1 is a demonstrative illustration of a semiconductor structure 100 during an intermediate step of a method of iteratively switching between isotropic and anisotropic etching techniques. More specifically, the method can start with fabricating an inter-level dielectric 104 (ILD) covering a gate structure 150 and a nitride layer 112, where the gate structure 150 and the nitride layer 112 are on a substrate 102.

The substrate 102 may be any material known in the art, such as, for example, a bulk semiconductor material. A source-drain 106 may be formed in the substrate 102 using any technique known in the art, such as, for example, ion implantation. The gate structure 150 may be formed adjacent to the source-drain region 106 and above the substrate 102. The gate structure 150 may include a gate 122, a gate spacer 114, and a gate cap 116. The gate structure 150 may be formed using any technique known in the art, such as, for example, gate first or gate last techniques (i.e. replacement gate). The gate cap 116 and gate spacers 114 may be any material known in the art, such as, for example, high density plasma nitride and spacer (HDP). The nitride layer 112 may be formed on the substrate 102 and on the source-drain region 106. The nitride layer 112 may be deposited by any technique known in the art and may be any material known in the art, such as, for example, atomic-layer deposited nitride (ALD) or plasma enhanced ALD (PEALD). The nitride layer 112 may be used as an etch stop to prevent over etching. In an embodiment, similar materials may be used for the gate cap 116, gate spacers 114, and the nitride layer 112 such as, for example HDP $S_iN$. The ILD 104 may be formed above the gate structure 150 and above the nitride layer 112 using any technique known in the art, such as, for example, CVD deposition. The ILD 104 may have a thickness ranging from about 150 nm to 250 nm. The ILD may be any material known in the art, such as, for example, a combination of flowable chemical vapor deposition oxide (FCVD), high density plasma oxide (HDP) and plasma enhanced tetra ethyloxy silane oxide (PTEOS). The ILD 104 may be planarized and prepared for etching. A mask 124 may be used to expose a first surface 132 of the ILD 104. The mask 124 may be formed using materials including, for example, titanium-nitride (TiN), titanium anti-reflective coating (TiARC), hafnium anti-reflective coating (hfARC), amorphous carbon (a-C), carbon (a-Si), or NBlock and may have a thickness ranging from about 10 nm to 40 nm. The first surface 132 may be above a portion of the gate structure 150 and above a portion of the source-drain region 106.

Figure 2:
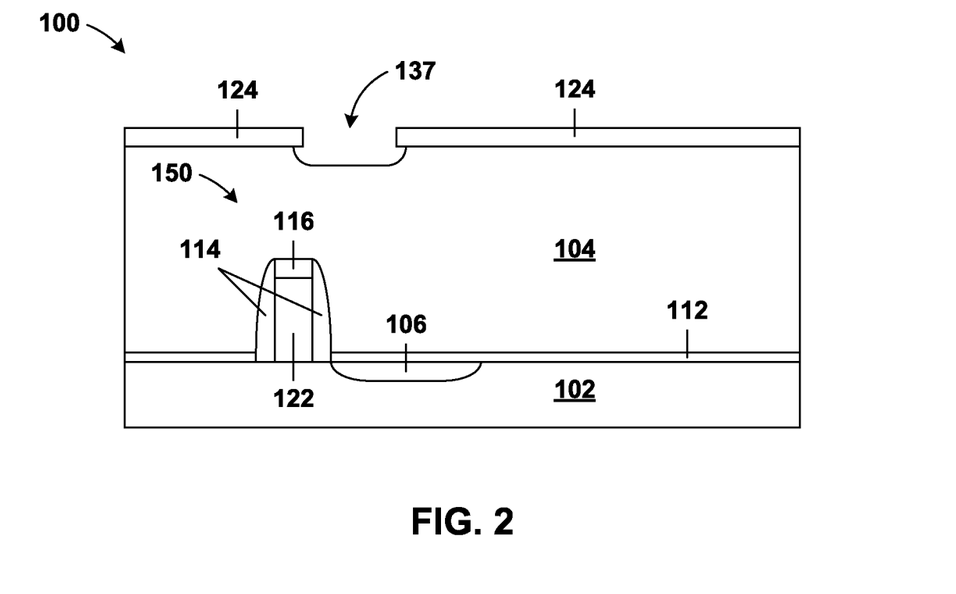
FIG. 2 illustrates a trench being etched in a semiconductor structure according to an exemplary embodiment.
Figure 3:
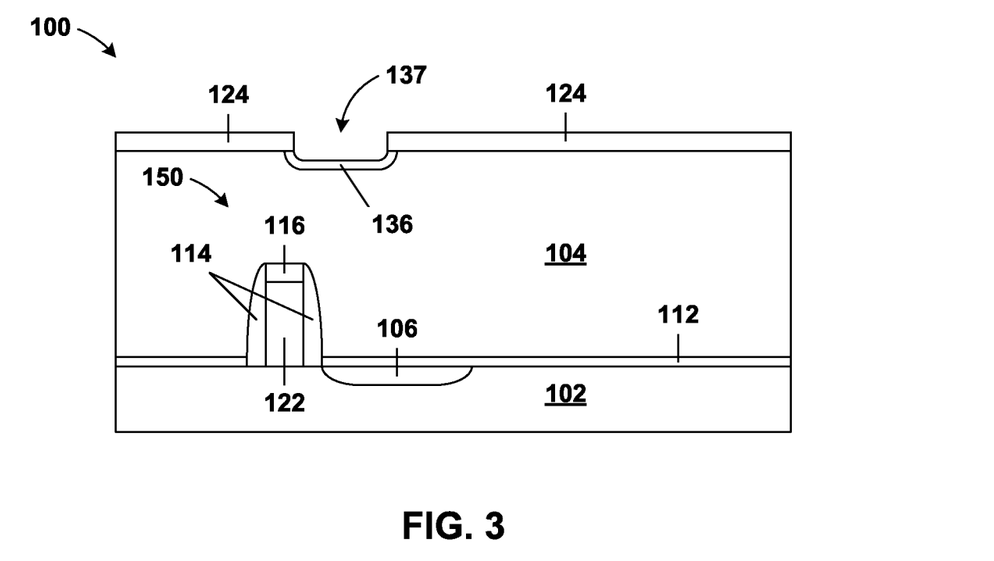
FIG. 3 is a cross-sectional view of a semiconductor structure according to an exemplary embodiment and illustrates the formation of a byproduct on an exposed surface of the trench.
Figure 4:
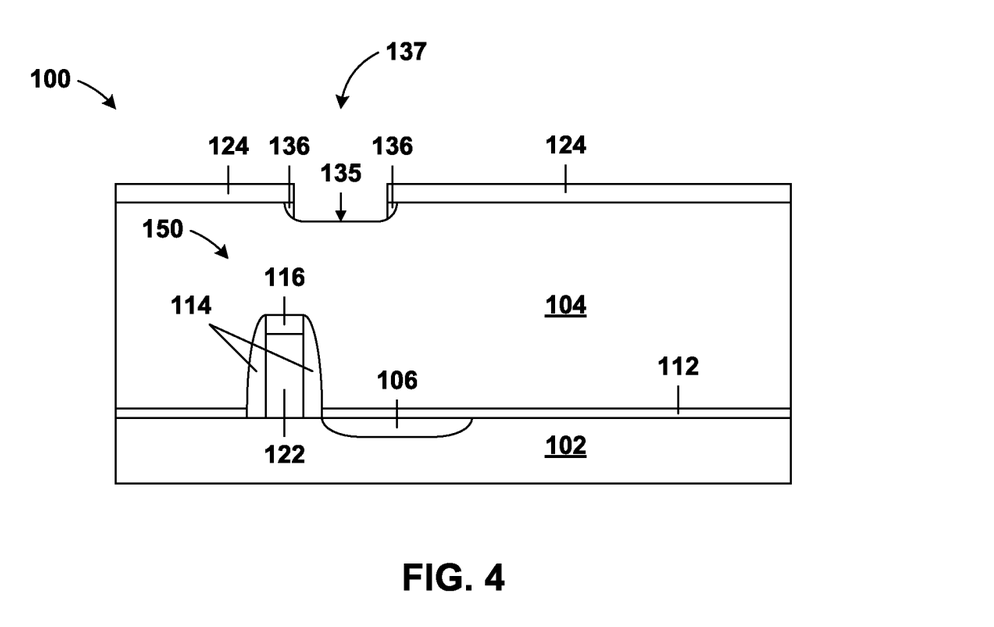
FIG. 4 is a cross-sectional view of a semiconductor structure according to an exemplary embodiment and illustrates the removal of the byproduct from a horizontal surface of the trench.

FIGS. 2, 3, and 4 are demonstrative illustrations of the semiconductor structure 100 during an intermediate step of a method of iteratively switching between isotropic and anisotropic etching techniques. More specifically, the method may include etching a portion of the ILD 104 using COR etching to form a trench 137. It should be noted FIGS. 2, 3, and 4 illustrate a first iteration of the combined etching technique.

The trench 137 may be formed by a first etch iteration which may remove a small amount of material from the ILD 104. The amount of ILD 104 removed during each iteration may be around 5 nm. The COR process may etch in all directions but may be highly selective to oxides against nitrides. Because of the high selectivity, the effects to the mask 124 may be small, however, there may be a slight undercut (scalaping) beneath the mask 124. COR etching may create a byproduct 136, such as, for example Ammonium hexafluorosilicate, which may conformally form over all exposed ILD 104 surfaces. The byproduct 136 may be removed from a horizontal surface of the trench 137 using an anisotropic etching technique, such as, for example, low bias anisotropic selective sputtering. The removal of the byproduct 136 from the horizontal surface of the trench 137 may then expose a second surface 135.

Figure 5:
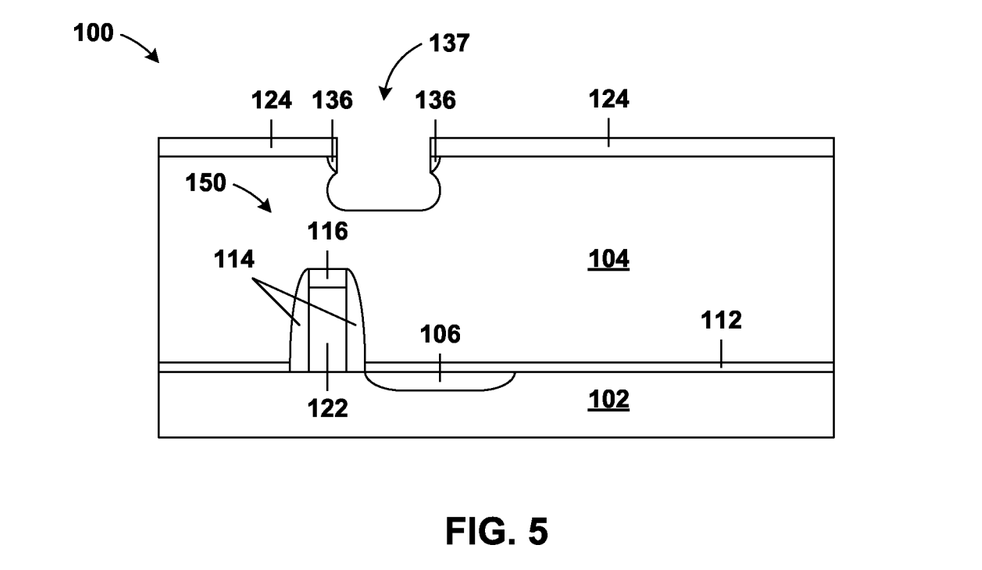
FIG. 5 is a cross-sectional view of a semiconductor structure according to an exemplary embodiment and illustrates an iteration of etching the trench.
Figure 6:
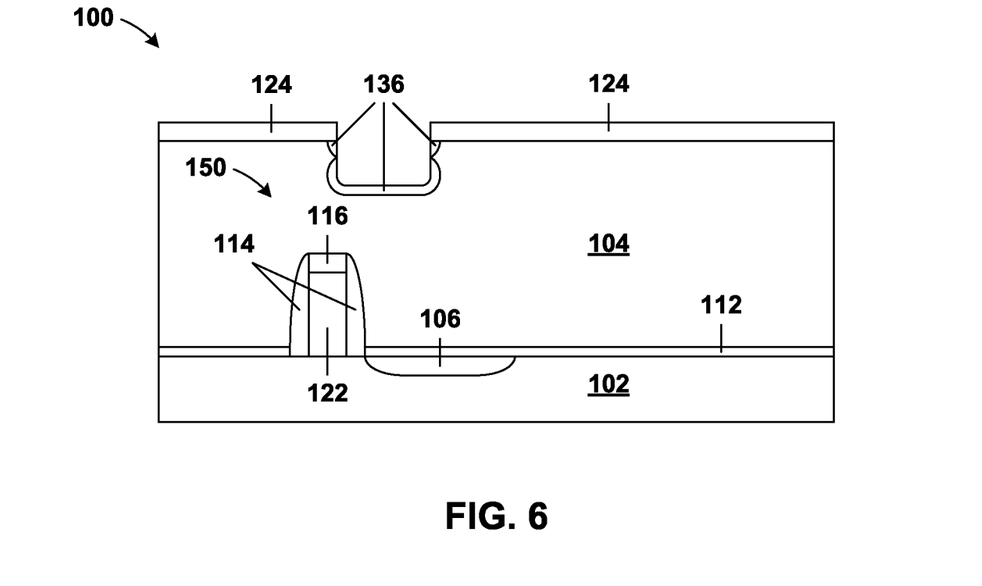
FIG. 6 is a cross-sectional view of a semiconductor structure according to an exemplary embodiment and illustrates the formation of a byproduct on the exposed surfaces of the trench.
Figure 7:
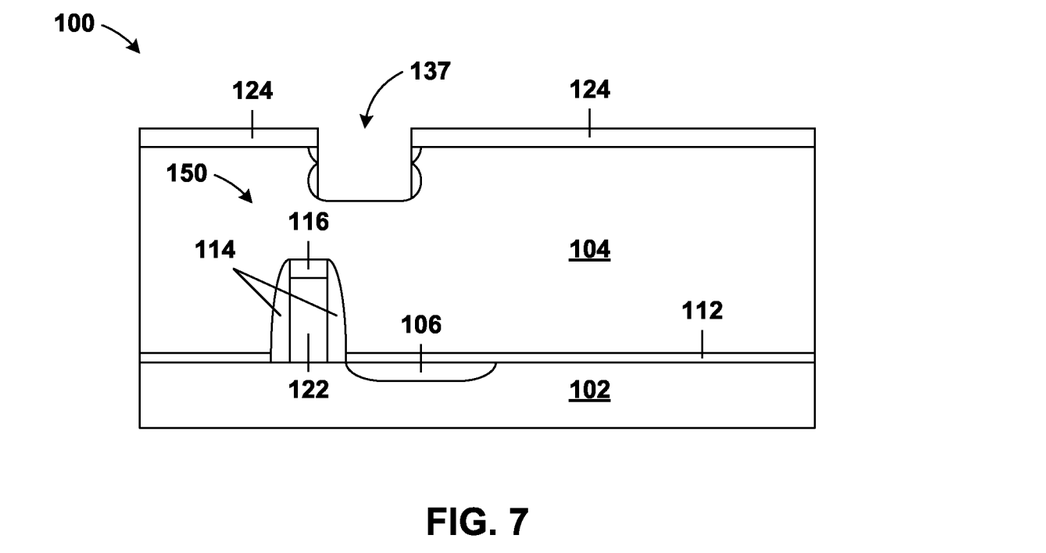
FIG. 7 is a cross-sectional view of a semiconductor structure according to an exemplary embodiment and illustrates the removal of the byproduct from a horizontal surface of the trench.

FIGS. 5, 6, and 7 are demonstrative illustrations of the semiconductor structure 100 during an intermediate step of a method of iteratively switching between isotropic and anisotropic etching techniques. More specifically, the method may include a second iteration of the steps described above with reference to FIGS. 2, 3, and 4 while illustrating the result of possible undercutting.

The second etch iteration may be used to further form the trench 137. The second etch iteration may only remove a small amount of the ILD 104 material as described for the first iteration. The second etch iteration and all subsequent iterations may include a COR etching technique, which may be selective to the ILD 104 against the byproduct 136 already present on the trench 137 sidewalls. As illustrated in FIG. 5, there may be undercutting created by the COR etching. FIG. 6 illustrates the possible formation of the byproduct 136 of the COR etching technique on a sidewall and a bottom of the trench 137. As illustrated in FIG. 7, the byproduct 136 may be removed from the horizontal surface using an anisotropic etching technique, such as, for example, low bias anisotropic selective sputtering. As a result, the byproduct 136 remaining on the sidewalls may not be uniform because of the alternating methods of etching and the possible undercutting.

Figure 8:
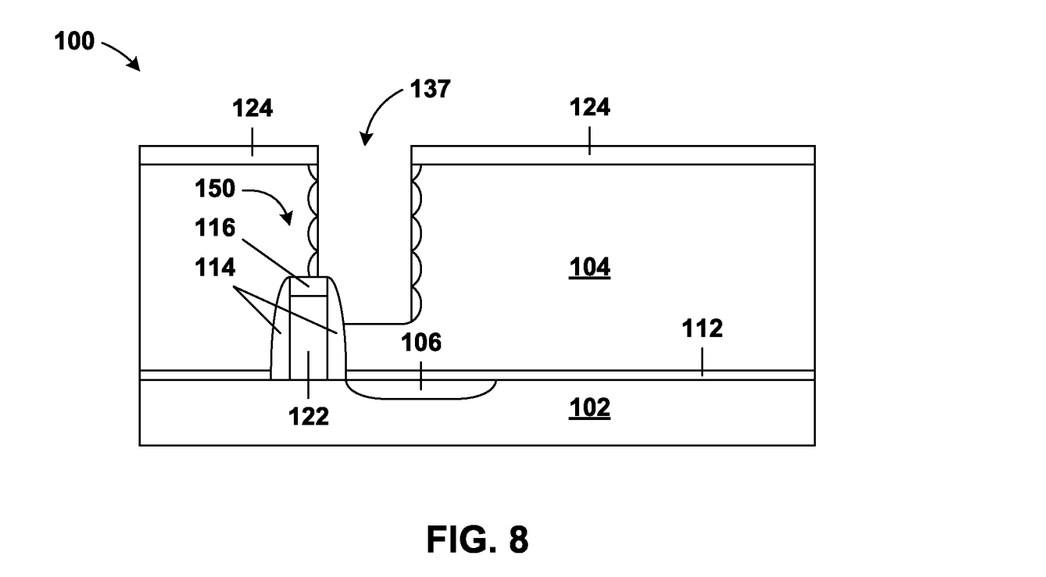
FIG. 8 is a cross-sectional view of a semiconductor structure according to an exemplary embodiment and illustrates an iteration of etching the trench.

FIG. 8 is a demonstrative illustration of the semiconductor structure 100 during an intermediate step of a method of iteratively switching between isotropic and anisotropic etching techniques. More specifically, the method may include etching a portion of the ILD 104 after exposing a portion of the gate cap 116 or the gate spacer 114.

The gate cap 116 and the gate spacer 114 may be exposed after a given number of etch iterations. The etching techniques used may be selective against the materials of the gate cap 116 and the gate spacer 114. As illustrated, the selectivity of the etchant may allow for continued vertical etching without significantly affecting the gate cap 116 or the gate spacer 114. In an embodiment, COR etching may be used, selective to the ILD 104 against the gate cap 116 and the gate spacer 114. After the COR etching, a possible formation of the byproduct 136 may conformally form on the sidewalls and the bottom of the trench 137. The byproduct 136 may be removed from the horizontal surface using an anisotropic etching technique, such as, for example, low bias anisotropic selective sputtering. Low bias anisotropic selective sputtering may be able to remove the byproduct 136 without significantly affecting the gate cap 116 or the gate spacers 114.

Figure 9:
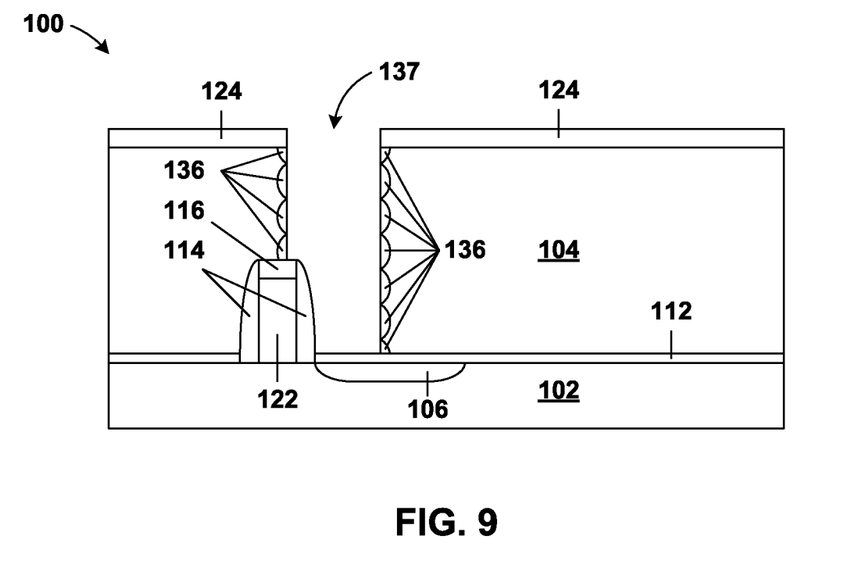
FIG. 9 is a cross-sectional view of a semiconductor structure according to an exemplary embodiment and illustrates completion of the etching technique and a final trench structure.
Figure 10:
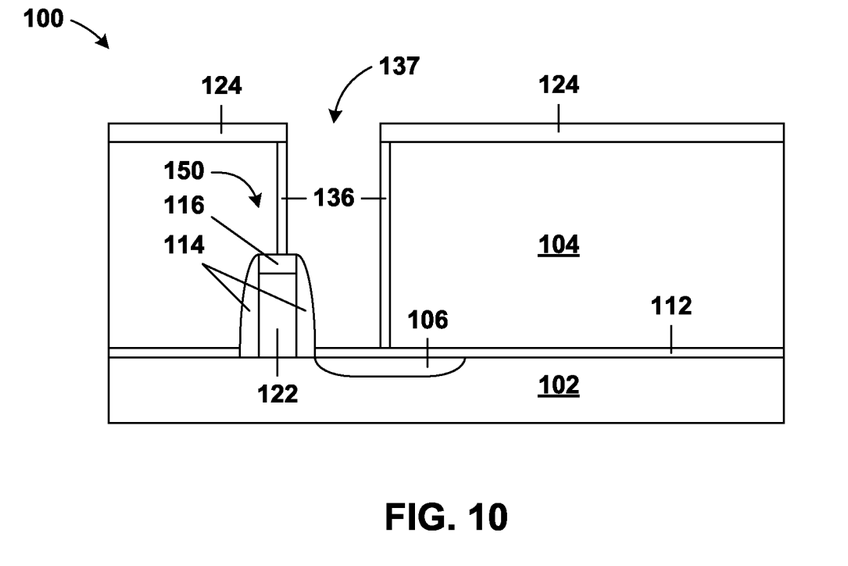
FIG. 10 is a cross-sectional view of a semiconductor structure according to another exemplary embodiment and illustrates completion of the etching technique and a final trench structure.

FIGS. 9 and 10 are demonstrative illustrations of the semiconductor structure 100 during an intermediate step of a method of iteratively switching between isotropic and anisotropic etching techniques. More specifically, the method may include a final iteration of the combined etch technique described above in which the gate cap 116, the gate spacer 114, and the nitride layer 112 may be exposed by the trench 137.

Typically, each etch iteration, after exposing the gate cap 116 and gate spacer 114, may etch a portion of gate cap 116 and the gate spacer 114, however, because of the high selectivity against the gate cap 116 and the gate spacer 114, the gate 122 may not be exposed before the nitride layer 112 is reached by the trench 137. The number of iterations that might be required to reach the nitride layer 112 may range from 10 iterations to 50 iterations. Additionally, the nitride layer 112 may act as an etch stop to prevent over etching. As illustrated in FIG. 9, the byproduct 136 on the sidewalls of the trench 137 may not be uniform along the sidewalls due to the isotropic etching techniques and the possible undercutting described above. However, the byproduct 136 may function as a uniform sidewall because the byproduct 136 may shield the ILD 104 from further lateral etching, as illustrated in FIG. 10.

Figure 11:
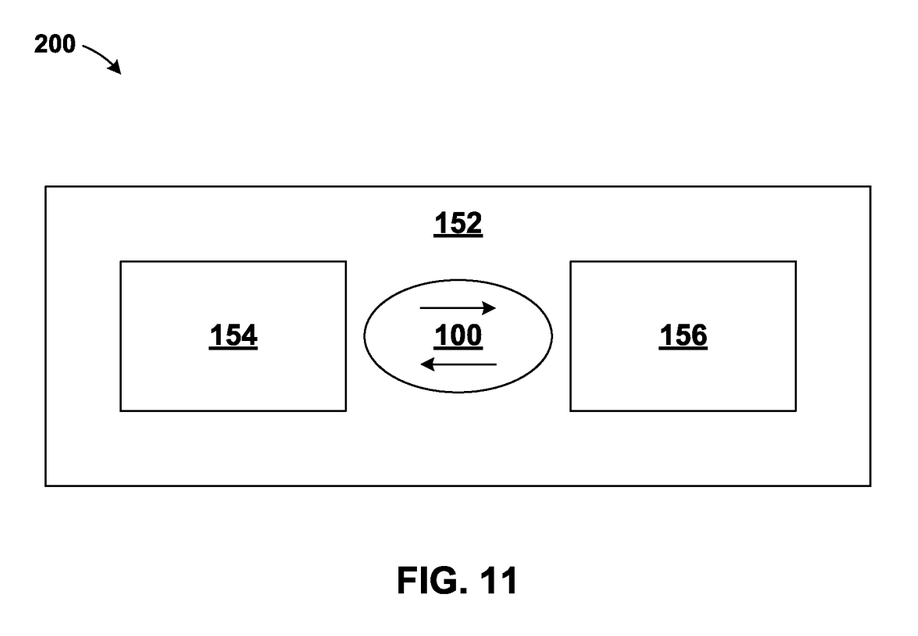
FIG. 11 illustrates a fabrication tool or apparatus according to an exemplary embodiment.

FIG. 11 is a demonstrative illustration of the apparatus 200 capable of iteratively switching between isotropic and anisotropic etching techniques. More specifically, the apparatus 200 may include a vacuum chamber 152, an isotropic etch chamber 154, and an anisotropic etch chamber 156.

The semiconductor structure 100 may be hydroscopic and may require a vacuum chamber 152 to protect the semiconductor structure 100 during fabrication from contamination from external elements. In an embodiment, the COR etching technique may occur within the isotropic etch chamber 154. Next, the semiconductor structure 100 may be moved to the anisotropic etch chamber 156. In an embodiment, the low bias anisotropic sputtering technique may occur in the anisotropic etch chamber 156. As discussed in detail above, small amounts of material may be removed in each of the isotropic etch chamber 154 and the anisotropic etch chamber 156. The semiconductor structure 100 may be moved back and forth between the two chambers (154, 156) in an iterative fashion until a desired trench depth is reached.

Figure 12:
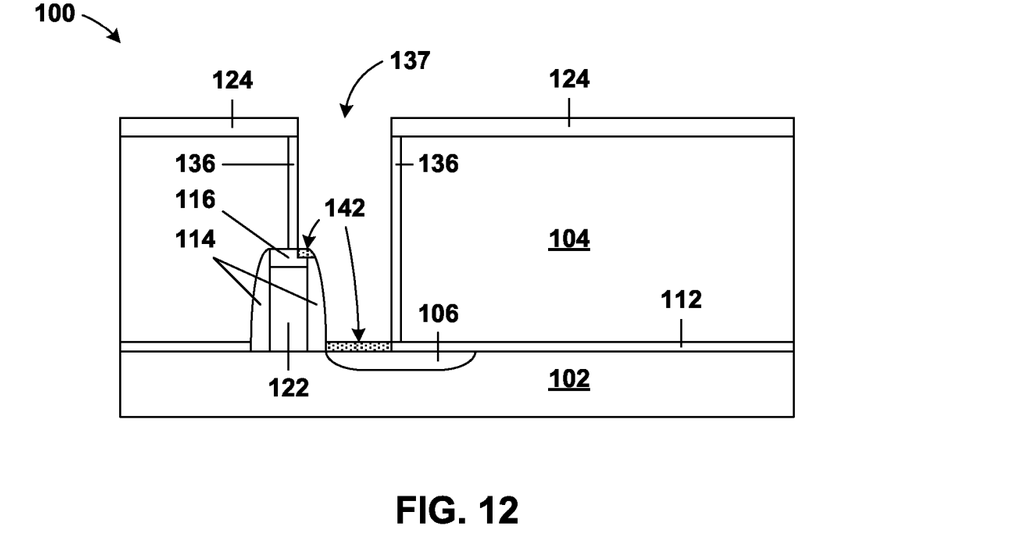
FIG. 12 illustrates a portion of the nitride to be oxidized and removed.
Figure 13:
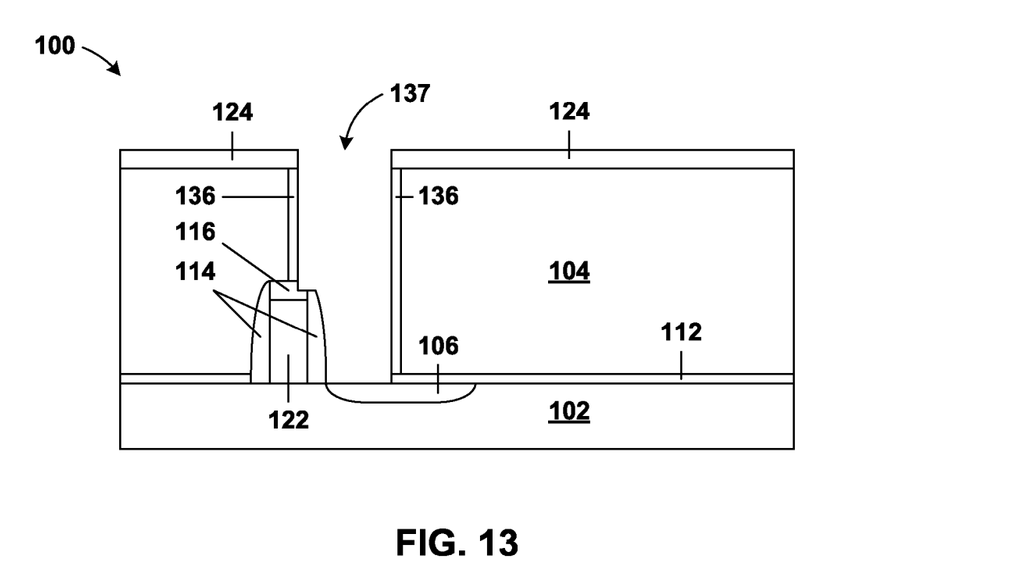
FIG. 13 illustrates the trench being etched in a semiconductor structure according to an exemplary embodiment.

FIGS. 12 and 13 are demonstrative illustrations of the semiconductor structure 100 during an intermediate step of a method to expose a source-drain region 106 using a combined etching technique involving iteratively switching between an oxidizing step and an isotropic etching step. More specifically, the method may include oxidizing a portion of the nitride layer 112 and then removing the oxidized portion of the nitride layer 112.

In an embodiment, a gas cluster ion beam (GCIB) may be used to oxidize the surface of the nitride layer 112. The thickness of the oxidized portion of the surface may range from 2 nm to 10 nm. The GCIB may form a removal material 142 on the nitride layer 112, the gate cap 116, and the gate spacer 114; where the removal material 142 is the oxidized portion of the nitride layer 112. Once the removal material 142 is formed, a COR etch may be used to remove the removal material. The non-oxidized portion of the nitride layer 112 may act as a sidewall barrier for the COR etch. Multiple iterations of oxidization and COR etching may be performed until the source-drain region 106 is exposed. To expose the source-drain region 106, the thickness of the nitride layer 112 may need to be removed from the bottom surface of the trench 137. The exposed materials may include the gate cap 116, gate spacers, and the nitride layer 112. The thickness of the gate cap 116 may be larger than the thickness of the nitride layer 112, possibly allowing the nitride layer to be removed, exposing the source-drain region 106, without exposing the gate 122.

Figure 14:
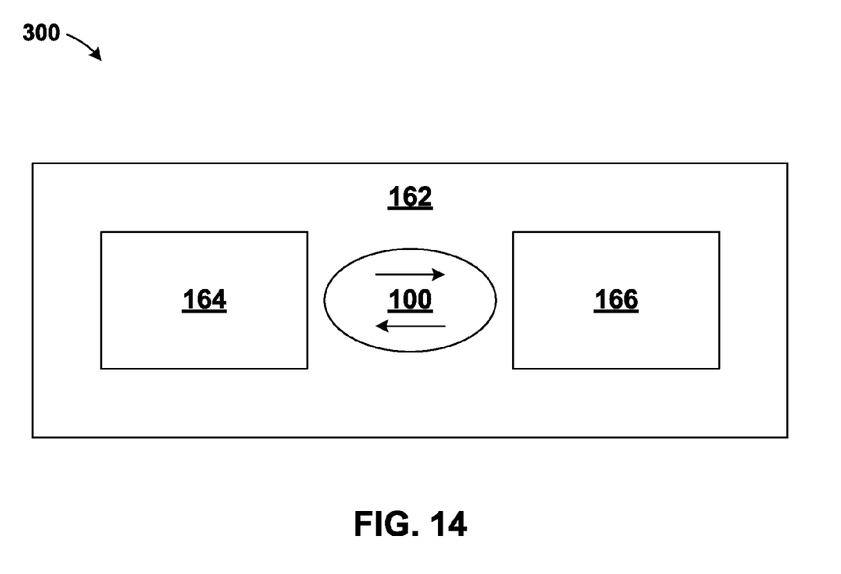
FIG. 14 illustrates a fabrication tool or apparatus according to an exemplary embodiment.

FIG. 14 is a demonstrative illustration of the apparatus 300 capable of iteratively switching between isotropic and oxidizing techniques. More specifically, the apparatus may include a second vacuum chamber 162, a second isotropic etch chamber 164, and an anisotropic oxidation chamber 166.

The semiconductor structure 100 may be hydroscopic and may require the second vacuum chamber 162 to protect the semiconductor structure 100 from atmosphere or any other unwanted external factors. In an embodiment, the anisotropic oxidation chamber 166 may use GCIB oxidation to oxidize about 2 nm to 10 nm of material on the semiconductor structure 100. To conduct a subsequent isotropic COR etch, the semiconductor structure 100 may be moved to the second isotropic etch chamber 164. The second isotropic etch chamber 164 may use COR etching to remove any exposed oxidized material. Once the oxidized material is removed, the semiconductor structure 100 may be moved back to the anisotropic oxidation chamber 166 and the steps may be reiterated until a desired amount of material has been removed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    forming a semiconductor structure including a source-drain region in a substrate and adjacent to a gate structure and a nitride layer on the source-drain region, wherein the gate structure includes a gate, a gate cap on a top surface of the gate, and a gate spacer on a sidewall surface of the gate and a sidewall surface of the gate cap;
    forming a dielectric layer on the nitride layer and on the gate structure;
    forming a contact trench in the dielectric layer by iteratively etching until the nitride layer is exposed, the contact trench exposing the gate cap and the gate spacer, each iterative etching step comprising:
        removing a portion of the dielectric layer using an isotropic etching technique, the isotropic etching technique produces a byproduct that remains along a sidewall and a bottom of the contact trench; and
        removing the byproduct only from the bottom of the contact trench using an anisotropic etching technique such that the byproduct present along the sidewall of the contract trench remains intact; and
    forming a nitride trench in the nitride layer by iteratively etching until the source-drain region is exposed, each iterative etching step comprising:
        oxidizing portions of the nitride layer, the gate cap and the gate spacer that are exposed by the contact trench; and
        removing the oxidized portions of the nitride layer, the gate cap and the gate spacer using an isotropic etching technique.

2. The method of claim 1, wherein the isotropic etching technique is a chemical oxide removal.

3. The method of claim 1, wherein the anisotropic etching technique is a low bias anisotropic selective sputtering.

4. The method of claim 1, wherein the byproduct is an ammonium hexafluorosilicate.

5. The method of claim 1, wherein gas cluster ion beams are used to oxidize the portions of the nitride layer, the gate cap and the gate spacer.

6. The method of claim 1, wherein low bias oxygen plasma sources are used to oxidize the portions of the nitride layer, the gate cap and the gate spacer.

7. The method of claim 1, wherein chemical oxide removal etching is used to remove the oxidized portions of the nitride layer, the gate cap and the gate spacer.

8. The method of claim 1, wherein the gate cap has a thickness greater than a thickness of the nitride layer.

9. The method of claim 1, wherein each of the nitride layer, the gate cap and the gate spacer comprises a high density plasma nitride.

10. The method of claim 1, wherein the dielectric layer comprises a combination of flowable chemical vapor deposition oxide, high density plasma oxide and plasma enhanced tetra ethyloxy silane oxide.

11. The method of claim 1, further comprising forming a mask layer over the dielectric layer prior to the forming the contact trench.

* * * * *